United States Patent
Hara et al.

(10) Patent No.: US 9,854,684 B2
(45) Date of Patent: Dec. 26, 2017

(54) COMPONENT MOUNTING MACHINE

(71) Applicant: FUJI MACHINE MFG. CO., LTD., Chiryu (JP)

(72) Inventors: Kenji Hara, Kariya (JP); Masayuki Tashiro, Nishio (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 227 days.

(21) Appl. No.: 14/893,279

(22) PCT Filed: Jun. 27, 2013

(86) PCT No.: PCT/JP2013/067639
§ 371 (c)(1),
(2) Date: Nov. 23, 2015

(87) PCT Pub. No.: WO2014/207861
PCT Pub. Date: Dec. 31, 2014

(65) Prior Publication Data
US 2016/0128204 A1    May 5, 2016

(51) Int. Cl.
*H05K 3/30* (2006.01)
*H05K 13/08* (2006.01)
(Continued)

(52) U.S. Cl.
CPC ........... *H05K 3/30* (2013.01); *H05K 13/0061* (2013.01); *H05K 13/0452* (2013.01); *H05K 13/08* (2013.01)

(58) Field of Classification Search
CPC .. H05K 3/30; H05K 13/0061; H05K 13/0452; H05K 13/08
See application file for complete search history.

(56) References Cited

U.S. PATENT DOCUMENTS 4,731,923 A * 3/1988 Yagi ................... H05K 13/0413
228/6.2
4,881,319 A * 11/1989 Yagi ................... H05K 13/0413
228/6.2
(Continued)

FOREIGN PATENT DOCUMENTS

JP    2006 253457    9/2006
JP    2007-73981    3/2007
(Continued)

OTHER PUBLICATIONS

Extended European Search Report dated Jan. 19, 2017 in Patent Application No. 13888015.8.
(Continued)

*Primary Examiner* — Carl Arbes
(74) *Attorney, Agent, or Firm* — Oblon, McClelland, Maier & Neustadt, L.L.P.

(57) ABSTRACT

A component mounting machine includes a board conveyance device, a component supply device, a component transfer device which includes a mounting head and a head driving mechanism, and a mounting order control device. The component mounting machine partitions a long printed circuit board of a length exceeding a mounting station into a plurality of mounting areas, sequentially positions each mounting area in the mounting station, and mounts the electronic components. The mounting order control device performs control to change the mounting order of the electronic components.

7 Claims, 7 Drawing Sheets

(51) Int. Cl.
*H05K 13/00* (2006.01)
*H05K 13/04* (2006.01)

(56) References Cited

U.S. PATENT DOCUMENTS

| | | | | |
|---|---|---|---|---|
| 5,369,493 | A * | 11/1994 | Tomita | H05K 13/0413 356/400 |
| 5,778,525 | A * | 7/1998 | Hata | H05K 13/0413 29/714 |
| 6,000,123 | A * | 12/1999 | Munezane | H05K 13/0452 29/721 |
| 6,161,277 | A * | 12/2000 | Asai | H05K 13/08 198/586 |
| 6,246,789 | B1 * | 6/2001 | Hosotani | H05K 13/08 382/151 |
| 6,526,651 | B1 * | 3/2003 | Hwang | H05K 13/0061 29/740 |
| 7,331,105 | B2 * | 2/2008 | van der Graaf | H05K 13/08 29/740 |
| 7,761,977 | B2 * | 7/2010 | Thomassen | H05K 13/0069 198/369.1 |
| 2010/0050429 | A1 | 3/2010 | Maenishi | |

FOREIGN PATENT DOCUMENTS

| | | |
|---|---|---|
| JP | 2007-141920 A | 6/2007 |
| JP | 2007 141966 | 6/2007 |
| JP | 2009-177213 A | 8/2009 |
| JP | 2012-60191 | 3/2012 |
| JP | 2013 110371 | 6/2013 |

OTHER PUBLICATIONS

Final Rejection dated May 23, 2017 in Japanese Patent Application No. 2015-523749 (with English machine Translation).
International Search Report dated Aug. 20, 2013 in PCT/JP13/067639 Filed Jun. 27, 2013.
Office Action dated Oct. 18, 2016 in Japanese Patent Application No. 2015-523749 (English translation only).

* cited by examiner

COMPONENT MOUNTING MACHINE

TECHNICAL FIELD

The present disclosure relates to a component mounting machine which mounts multiple electronic components on a printed circuit board. More specifically, the present disclosure relates to a component mounting machine in which at least two types of mounting heads are used together in relation to a long printed circuit board of a length exceeding a mounting station which serves as a mounting execution location.

BACKGROUND ART

As a device which produces printed circuit boards on which multiple electronic components are mounted, there are a solder printer, a component mounting machine, a reflow furnace, a printed circuit board inspection machine, and the like, and there are many cases in which a printed circuit board production line is constructed by linking these. Of these, the component mounting machine is generally provided with a board conveyance device, a component supply device, and a component transfer device. The board conveyance device performs the carrying-in, carrying-out, and the positioning of the printed circuit board. The board conveyance device includes a conveyor device which performs the carrying-in and carrying-out of a printed circuit board in the mounting station by placing the printed circuit board and rotating the conveyor belts, and a clamp device which pushes up the printed circuit board to lift the printed circuit board from the conveyor device, positions the printed circuit board on the mounting station, and holds the printed circuit board. The component supply device supplies electronic components of a plurality of component types. Examples of the component supply device include a feeder supply device which supplies small chip components from a reel, and a tray supply device which supplies comparatively large electronic components from a tray. The component transfer device mounts electronic components on the printed circuit board. The component transfer device includes a mounting head which picks an electronic component from the component supply device and conveys the electronic component to the positioned printed circuit board, and a head driving mechanism which drives the mounting head.

PIE 1 discloses a technical example which enables the mounting of an electronic component on a long printed circuit board of a length exceeding the mounting station in this type of component mounting machine. In a printed circuit board assembly method of PTL 1, when a work head (the mounting head) on a printed circuit board (the long printed circuit board) which is positioned by a positioning device is no longer able to perform predetermined work, the position to which the printed circuit board is positioned is changed, and the work head performs the predetermined work. In other words, the position of the long printed circuit board is changed part way through a mounting operation, and the mounting is performed at each position from before and after the change.

As the component mounting machine, there is an automatic head exchanging type of device which selectively switches between a plurality of mounting heads and performs a mounting operation using the selected mounting head. In this case, for example, both a single nozzle head and a multi nozzle head are used as mounting heads. The single nozzle head is a head including one suction nozzle which picks an electronic component using a negative pressure. The multi nozzle head is a head including a revolver capable of holding and rotating, for example, four or twelve suction nozzles on a circular circumference.

In comparison to the single nozzle head, the multi nozzle head has the following characteristics. In other words, the multi nozzle head can pick a plurality of electronic components at once, and can mount the plurality of electronic components by merely performing a single reciprocal movement between the component supply device and the printed circuit board. Therefore, with the multi nozzle head, the average mounting time per single electronic component is short and the mounting efficiency is high. On the other hand, with the multi nozzle head, since the conveyance height when conveying the electronic components is reduced and the electronic components are in a low position when the revolver rotates, it is necessary to avoid interference between the electronic components on the bottom ends of the suction nozzles and the mounted electronic components. There are also restrictions in the separation distance between the plurality of suction nozzles in the multi nozzle head, and the types of component which can be mounted are limited to electronic components which are short and small.

In order to avoid the interference between the electronic components described above, first mounting the short and small electronic components which can be mounted using the multi nozzle head, and subsequently mounting the remaining electronic components using the single nozzle head is generally adopted as the mounting order. Accordingly, it is possible to make sufficient use of the high mounting efficiency of the multi nozzle head to shorten the total mounting time which is necessary for mounting all of the predetermined electronic components.

As the component mounting machine, there is a two head facing type of device in which a head driving mechanism which drives a mounting head is disposed on either side of the mounting station to interpose the mounting station. In this type of device, in most cases, the two mounting heads are of different types, and the component types of the electronic components to be mounted are divided therebetween. In order to avoid mutual interference between the mounting operations of the two mounting heads, generally, while one head driving mechanism enters the mounting station, the other head driving mechanism is not made to enter the mounting station.

CITATION LIST

Patent Literature

[PTL 1] JP-A-2006-253457

SUMMARY

Technical Problem

Incidentally, in the technological example of PLT 1, it is undoubtedly possible to mount electronic components on the entire surface of a printed circuit board by changing the position at which the printed circuit board (the long printed circuit board) is positioned. However, when the mounting order of the electronic components is not appropriate, a problem occurs in that the number of times the position is changed increases excessively and the necessary time increases. When a long printed circuit board is set as the target in an automatic head exchanging component mounting machine, the switching of the mounting heads and the positioning of the long printed circuit board are two factors which combine to influence the necessary time. Therefore, it is difficult to simply define the optimal mounting order of the electronic components in which the total mounting time which is necessary for a single long printed circuit board is rendered shortest. In the same manner in the two head facing component mounting machine, it is difficult to simply define the optimal mounting order of the electronic components.

The present disclosure is made in consideration of the problems of the related art described above, and an object of the present disclosure is to provide a plural head combined use component mounting machine capable of shortening a total mounting time in which all predetermined electronic components are mounted on a single long printed circuit board.

Solution to Problem

A component mounting machine according to an aspect which solves the problems described above includes a board conveyance device which conveys a printed circuit board to a mounting station and performs positioning and carrying-out, a component supply device which supplies electronic components of a plurality of component types, a component transfer device which includes a mounting head which picks the electronic components from the component supply device, conveys the electronic components to the positioned printed circuit board and mounts the electronic components thereon and a head driving mechanism which drives the mounting head, and a mounting order control device which controls changing of a mounting order of the electronic components, in which the component mounting machine partitions a long printed circuit board of a length exceeding the mounting station into a plurality of mounting areas, sequentially positions each mounting area in the mounting station and mounts the electronic components, in which an general-purpose mounting head which is capable of mounting many types of component and a high speed mounting head which is capable of mounting less types of component in comparison to the general-purpose mounting head, picks multiple electronic components at once, and conveys the electronic components at a low conveyance height are used together in the component transfer device, and in which the mounting order control device performs control to change the mounting order of the electronic components so as to reduce at least one of a number of times a mounting head which is operating is switched and a number of times the lone printed circuit board is positioned.

Accordingly, the number of times the mounting head is switched and the number of times the long printed circuit board is positioned are not excessively increased while mounting all of the predetermined electronic components on a plurality of mounting areas of a single long printed circuit board using the general-purpose mounting head and the high speed mounting head together. Therefore, the head switching time and the positioning time of the long printed circuit board are not excessively increased, and it is possible to shorten the total mounting time in which all of the predetermined electronic components are mounted on the single long printed circuit board.

For the disclosure according to an aspect, in the component mounting machine according to an aspect, the mounting order control device determines the mounting order of the electronic components so as to reduce the number of times the mounting head is switched, first by sequentially positioning each of the mounting areas of the long printed circuit board in the mounting station and causing the high speed mounting head to mount the electronic components of the component types which can be mounted, and subsequently by sequentially positioning each of the mounting areas in the mounting station and causing the general-purpose mounting head to mount the electronic components of the remaining component types.

Accordingly, it is possible to mount all of the predetermined electronic components by first performing the mounting using the high speed mounting head with all of the mounting areas of the long printed circuit board set as targets, and subsequently performing the mounting using the general-purpose mounting head with all of the mounting areas set as targets. Therefore, it is possible to use as much as possible the high mounting efficiency of the high speed mounting head, and additionally, it is possible to limit the head switching time with the switching of the mounting head set to only one time. Accordingly, it is possible to shorten the total mounting time.

For the disclosure according to an aspect, in the component mounting machine according to an aspect, the mounting order control device determines the mounting order of the electronic components so as to reduce the number of times the long printed circuit board is positioned, first by positioning a first mounting area of the long printed circuit board in the mounting station and causes each of the high speed mounting head and the general-purpose mounting head, in this order, to mount the electronic components which can be mounted by, and subsequently by sequentially positioning a second mounting area onward of the long printed circuit board in the mounting station and causing the general-purpose mounting head to mount the remaining electronic components.

Accordingly, it is possible to mount all of the predetermined electronic components by first performing the mounting using the high speed mounting head and the general-purpose mounting head with the first mounting area of the long printed circuit board set as a target, and subsequently performing the mounting using the general-purpose mounting had with the second mounting area onward set as targets. Therefore, the conveying and positioning of the long printed circuit board may be performed only once for each of the mounting areas, and it is possible to limit the positioning time of the long printed circuit board. Accordingly, it is possible to shorten the total mounting time.

In the disclosure according to an aspect, a mounting order control device simulates a mounting time during reduced had switching which is necessary to carry out a mounting order of electronic components which is defined in an aspect, and a mounting time during reduced positioning which is necessary to carry out a mounting order of electronic components which is defined in an aspect, and adopts the mounting order of the electronic components which has a shorter time.

Here, the mounting time during reduced head switching and the mounting time during reduced positioning change depending on the size of the long printed circuit board to be produced, the type, number and mounting positions of the electronic components to be mounted, and the performance of the component mounting machine and the like, and the magnitude relationship between the two can change. In response to this, since the mounting order control device performs a simulation and adopts the mounting order of the electronic components which has the shorter time, the mounting order is optimized, and it is possible to shorten the total mounting time by a maximum amount.

For the disclosure according to an aspect, in the component mounting machine according to an aspect, the component transfer device equips the general-purpose mounting head and the high speed mounting head in the head driving mechanism in an exchangeable manner.

Accordingly, it is possible to carry out the present disclosure using the automatic head exchanging component mounting machine, and each of the effects of an aspect described earlier occur.

For the disclosure according to an aspect, in the component mounting machine according to an aspect, the component transfer device includes a general-purpose side head driving mechanism which drives the general-purpose mounting head and a high speed side head driving mechanism which drives the high speed mounting head, and causes one of the general-purpose side head driving mechanism and the high speed side head driving mechanism to operate in the mounting station in a switchable manner.

Accordingly, it is possible to carry out the present disclosure using the two head facing component mounting machine, and each of the effects of an aspect described earlier occur.

For the disclosure according to an aspect, in the component mounting machine according to an aspect, the general-purpose mounting head is a single nozzle head which includes a single suction nozzle which picks the electronic component using a negative pressure, and the high speed mounting head is a multi nozzle head which includes a plurality of the suction nozzles and a revolver which holds the plurality of suction nozzles on a circular circumference and is capable of rotating.

Accordingly, it is possible to carry out the present disclosure using the component mounting machine which uses the single nozzle head and the multi nozzle head together, and at least one of the number of times the mounting head which is operating is switched and the number of times the long printed circuit board is positioned is reduced while using the extremely high mounting efficiency of the multi nozzle head. Therefore, it is possible to shorten the total mounting time.

BRIEF DESCRIPTION OF DRAWINGS

FIG. 5 is a diagram illustrating an operation in which electronic components are mounted on the long printed circuit board in the component mounting machine of the first embodiment.

FIG. 6 is a diagram illustrating an operation in which electronic components are mounted on a long printed circuit board in a component mounting machine of a second embodiment.

DESCRIPTION OF EMBODIMENTS

Figure 1:
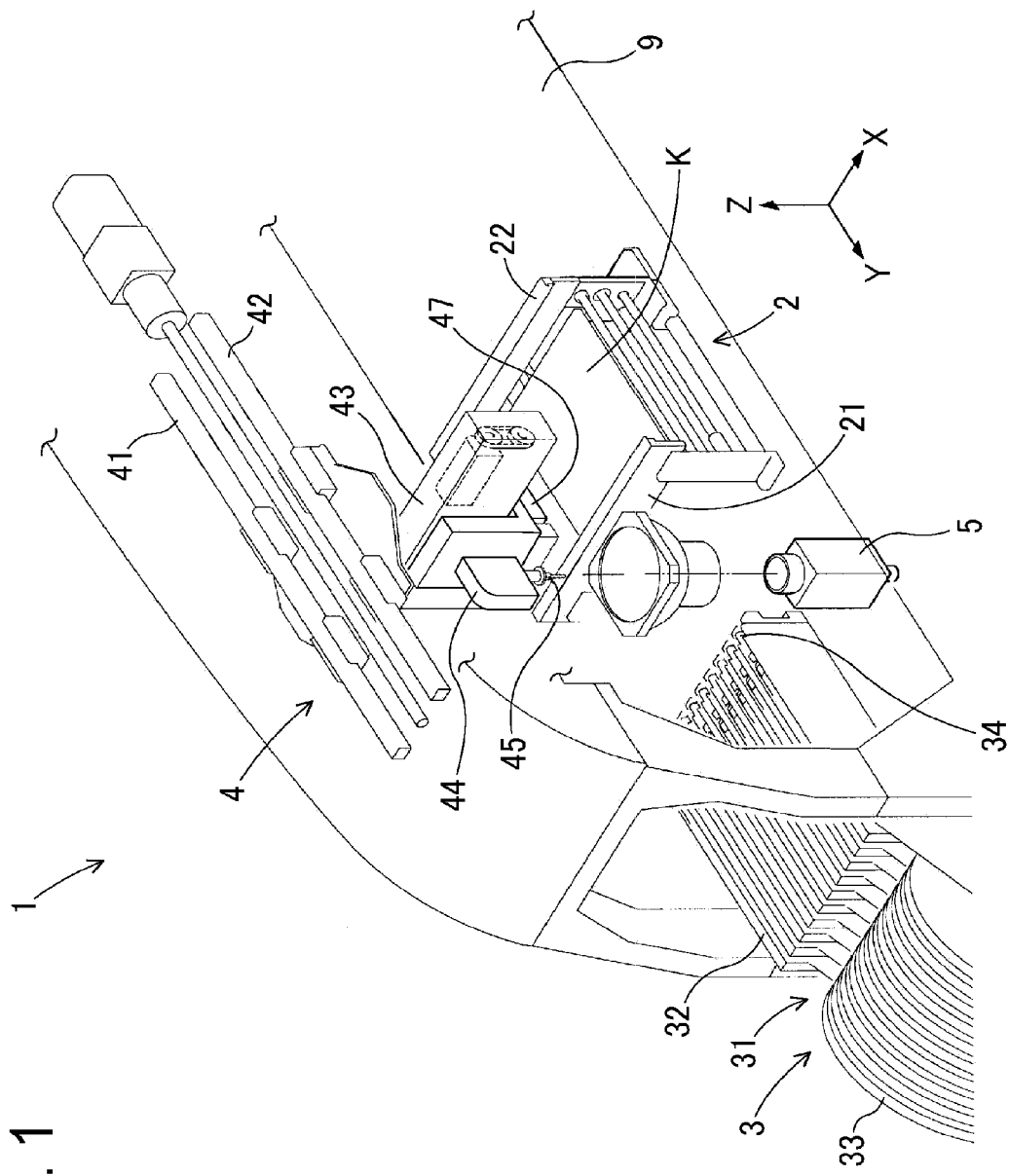
FIG. 1 is a perspective diagram illustrating the configuration of a component mounting machine of a first embodiment.

Description will be given of a component mounting machine 1 of a first embodiment of the present disclosure with reference to FIG. 1 to FIG. 5. FIG. 1 is a perspective diagram illustrating the configuration of the component mounting machine 1 of the first embodiment. The component mounting machine 1 is an automatic head exchanging type of device, and is configured by a board conveyance device 2, a component supply device 3, a component transfer device 4, and a component camera 5 being assembled onto a device table 9. Each of the devices 2 to 5 is controlled by a control computer which is omitted from the drawings, and each performs predetermined work.

The board conveyance device 2 carries a printed circuit board K into a mounting station, subjects the printed circuit board K to positioning and carries the printed circuit board out. The board conveyance device 2 is formed of first and second guide rails 21 and 22, a pair of conveyor belts, a clamp device, and the like. The first and second guide rails 21 and 22 span the center of the top portion of the device table 9 to extend in a transport direction (an X-axis direction) and are assembled onto the device table 9 so as to be parallel to each other. The pair of conveyor belts are provided directly beneath the first and second guide rails 21 and 22 such that the conveyor belts are disposed parallel to each other. The conveyor belts rotate in a state in which the printed circuit board K is placed on conveyor conveyance surfaces, and perform the carrying-in and carrying-out of the circuit board K on the mounting station which is set on the center portion of the device table 9. Note that, the conveyor belts are capable of rotating in a reverse direction in addition to the transport direction.

The clamp device is provided beneath the conveyor belts in a position corresponding to the mounting station. The clamp device pushes up the printed circuit board K, clamps the printed circuit board K in a horizontal orientation, and positions the printed circuit board K in the mounting station. Accordingly, the component transfer device 4 is capable of performing the mounting operation in the mounting station.

The component supply device 3 supplies electronic components of a plurality of component types. The component supply device 3 is a feeder system device and is provided on the front portion (the front-left side of FIG. 1) of the component mounting machine 1 in a longitudinal direction. The component supply device 3 includes multiple cassette feeders 31 which are attachable and detachable. The cassette feeder 31 is provided with a main body 32, a supply reel 33 which is provided on a rear portion of the main body 32, and a component pick-up section 34 which is provided on a distal end of the main body 32. A long and narrow tape (not illustrated) in which multiple components are sealed at a predetermined pitch is wound and held in the supply reel 33, the tape is pulled out at a predetermined pitch by a sprocket (not illustrated), the components are released from the sealed state and are sequentially conveyed to the component pick-up section 34.

The component transfer device 4 picks the electronic component from the component supply device 3, conveys the electronic component to the positioned printed circuit board K and mounts the electronic component thereon. The component transfer device 4 is an XY robot type of device capable of horizontal movement in the X-axis direction and a Y-axis direction. The component transfer device 4 is formed of a pair of Y-axis rails 41 and 42, a moving table 43, a head holder 44, mounting heads 45 and 46, and the like.

The pair of Y-axis rails 41 and 42 are arranged from a rear portion (the far-right side of FIG. 1) of the device table 9 in the longitudinal direction to above the component supply device 3 of the front portion. The moving table 43 is mounted on the Y-axis rails 41 and 42, and is capable of moving in the Y-axis direction. The head holder 44 is mounted on the moving table 43 to be movable in the X-axis direction. The general-purpose mounting head 45 and the high speed mounting head 46 are equipped in an exchangeable manner on the bottom surface of the head holder 44. The head holder 44 is driven in the two horizontal directions (the X and Y directions) by two servo motors. The head driving mechanism is formed of the two servo motors, the Y-axis rails 41 and 42, the moving table 43, and the like.

Aboard camera 47 which images the printed circuit board K is provided on the bottom face of the moving table 43 to face downward. The board camera 47 reads a fiducial mark of the positioned printed circuit board K and detects the position error of the printed circuit board K. Accordingly, coordinate values on the printed circuit board K are corrected, and the control of the position at which the electronic component is mounted is performed accurately.

The component camera 5 is provided to face upward on the top surface of the device table 9 between the board conveyance device 2 and the component supply device 3. The component camera 5 images and detects the state of the component which is picked part way through the mounting heads 45 and 46 moving above the printed circuit board K from the component supply device 3. When the component camera 5 detects an error in the picking position or shifting of the rotational angle of the electronic component, bending of a lead, or the like, the component mounting operation is subjected to minute adjustments as necessary, and a component which is difficult to mount is discarded.

The component mounting machine 1 is provided with a control computer which is omitted from the drawings. The control computer controls the component mounting operation based on various design information starting with the correspondence relationship between the type of printed circuit board to be produced and the component type of the electronic component to be mounted, imaging data of the board camera 47 or the component camera 5, detection data of a sensor which is omitted from the drawings, and the like. As described later, the control computer has a function of a mounting order control device of the present disclosure.

Figure 2:
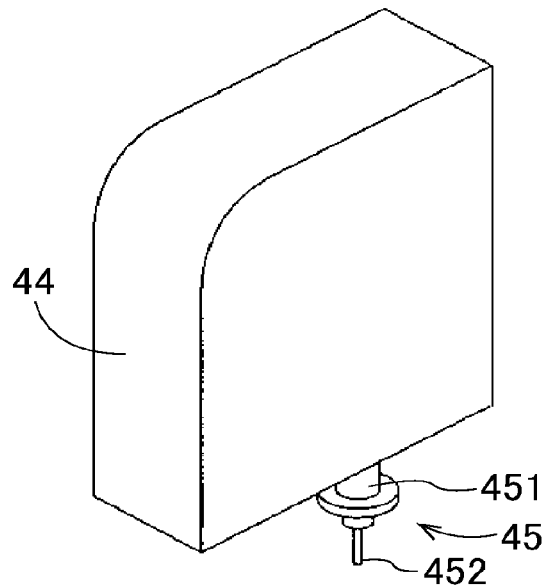
FIG. 2 is a perspective diagram illustrating a general-purpose mounting head.

Next, description will be given of the two types of mounting heads 45 and 46 which are used together in the component transfer device 4. The two types of mounting heads 45 and 46 are disposed in an exchanging station, which is omitted from the drawings, of the top surface of the device table 9, and are attached to the head holder 44 in an exchangeable, manner. The two types of mounting heads 45 and 46 are automatically exchanged by the control from the control computer. FIG. 2 is a perspective diagram illustrating the general-purpose mounting head 45, and FIG. 3 is a perspective diagram illustrating the high speed mounting head 46.

The general-purpose mounting head 45 illustrated in FIG. 2 is a single nozzle head including one suction nozzle 452 which picks an electronic component using a negative pressure. The general-purpose mounting head 45 is configured by the single suction nozzle 452 being disposed on the bottom side of a head main body 451. The general-purpose mounting head 45 is held by the head holder 44 to be capable of being lifted and lowered in a Z-axis direction and capable of rotating in a horizontal plane. The suction nozzle 452 of the general-purpose mounting head 45 is capable of mounting large electronic components and specially shaped electronic components in addition to the small electronic components, in other words, there are many types of component which can be mounted and the suction nozzle 452 has excellent versatility. On the other hand, the general-purpose mounting head 45 moves reciprocally between the component supply device 3 and the printed circuit board K each time a single electronic component is mounted, and the mounting efficiency is low.

Figure 3:
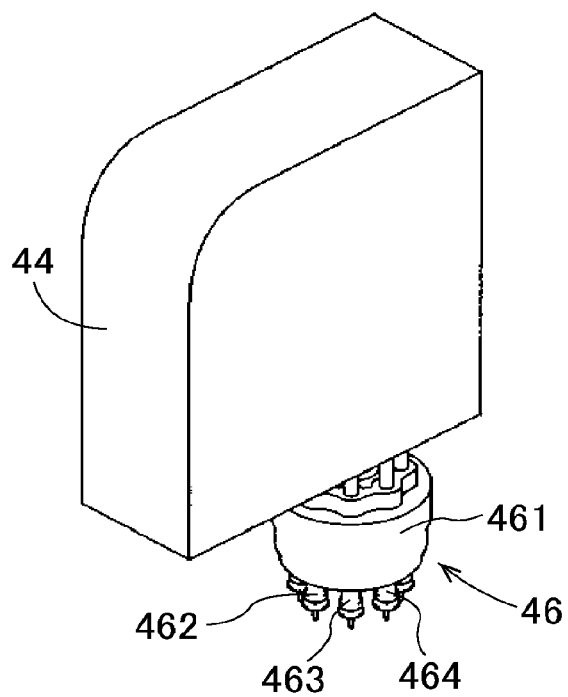
FIG. 3 is a perspective diagram illustrating a high speed mounting head.

The high speed mounting head 46 illustrated in FIG. 3 is a multi nozzle head which includes eight suction nozzles 462 to 464 (reference symbols of others are omitted) and a revolver 461. The revolver 461 is held by the head holder 44 to be capable of rotating in a horizontal plane. The eight suction nozzles 462 to 464 are held on the circular circumference of the bottom surface of the revolver 461 to face downward. The eight suction nozzles 462 to 464 are configured such that any one is selected and can be lifted or lowered in the Z-axis direction.

Since there are restrictions to the separation distance between the plurality of adjacent suction nozzles 462 to 464 of the high speed mounting head 46, the size of the electronic components which can be picked is limited. In comparison with the general-purpose mounting head 45, since the conveying height is lowered when the electronic components are conveyed with the high speed mounting head 46 and the electronic components assume a low position when the revolver 461 rotates, it is necessary to avoid the interference between the electronic components being picked and the pre-mounted electronic components. Therefore, in the high speed mounting head 46, the types of components which can be mounted are limited to the short and small electronic components such as chip resistors and chip capacitors. Since the high speed mounting head 46 can pick a maximum of eight electronic components at once, and can mount the maximum of eight electronic components by merely performing a single reciprocal movement between the component supply device 3 and the printed circuit board K, the mounting efficiency is high. Note that, the number of nozzles of the high speed mounting head 46 is not limited to eight, and, for example, there are also high speed mounting heads in which the number of nozzles is two, four, or twelve.

Although omitted from the drawings, a drive unit and an air pressure control unit are provided in an inside portion of the head holder 44. The drive unit is a portion which drives the general-purpose mounting head 45 and the high speed mounting head 46 and uses a servo motor as a drive source. The air pressure control unit is a portion which performs the generation and control of a negative pressure when picking the electronic components and is formed of an air pump, a valve, and the like.

Next, description will be given of a mounting operation to a standard printed circuit board which is ordinarily performed by the component mounting machine 1 of the first embodiment. The standard printed circuit board is a printed circuit board in which the length of the board in the transport direction its in the mounting station. In the mounting operation to the standard printed circuit board, first, the board conveyance device 2 conveys the standard printed circuit board to the mounting station and performs positioning. Next, the mounting heads 45 and 46 of the component transfer device 4 move to the component supply device 3, pick the electronic components, and subsequently move, to above the component camera 5. Then, the component camera 5 images the component suction state of the mounting heads 45 and 46, and the control computer determines whether or not mounting is possible based on the imaging data. Ordinarily, it is determined that mounting is possible and the mounting heads 45 and 46 convey the electronic components to the standard printed circuit board and mount the electronic component thereon. It is possible to mount all of the predetermined electronic components on the standard printed circuit board by repeating this mounting cycle. When the mounting is completed, the board conveyance device 2 ejects the standard printed circuit board in the transport direction and subsequently begins the conveying of a next standard printed circuit board. Note that, the repeating of the mounting cycle is performed in the same manner in the mounting process to a long printed circuit board KL which will be described next.

Figure 4:
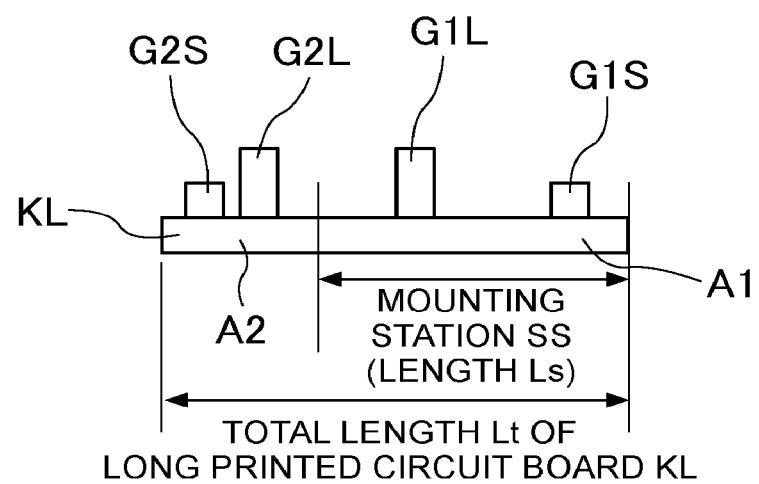
FIG. 4 is a side view illustrating a long printed circuit board.

Next, description will be given of a mounting operation to the long printed circuit board KL of the component mounting machine 1 of the first embodiment and the control method thereof. FIG. 4 is a side view illustrating the long printed circuit board KL. As illustrated, a total length Lt of the long printed circuit board KL in the transport direction exceeds a length Ls of a mounting station SS. Firstly, the control computer partitions a range from the front edge of the long printed circuit board KL in the transport direction to a length Ls as a first mounting area A1, and partitions a range to the rear side of the first mounting area A1 of the long printed circuit board KL as a second mounting area A2. In this case, since the mounting operation is divided into the first mounting area A1 and the second mounting area A2 and performed, it is necessary to position the long printed circuit board KL at least two times.

Secondly, the control computer classifies all of the predetermined electronic components to be mounted on the long printed circuit board KL into four component groups. In other words, the control computer sets the short and small electronic components, the mounting positions of which are within the first mounting area A1, which can be mounted using the high speed mounting head 46 to a first small component group G1S, and sets the large or specially shaped electronic components, the mounting positions of which are within the first mounting area A1, which are limited to mounting using the general-purpose mounting head 45 to a first large component group G1L. Similarly, the control computer sets the short and small electronic components, the mounting positions of which are within the second mounting area A2, which can be mounted using the high speed mounting head 46 to a second small component group G2S, and sets the large or specially shaped electronic components, the mounting positions of which are within the second mounting area A2, which are limited to mounting using the general-purpose mounting head 45 to a second large component group G2L in FIG. 4, although each of the component groups G1S, G1L, G2S, and G2L is omitted and illustrated using a single rectangle for each, in actuality, each plurality of electronic components is dispersed and mounted in each of the areas A1 and A2.

Thirdly, the control computer defines the mounting order of all of the electronic components so as to reduce the number of times the mounting heads are switched. Specifically, the control computer controls the mounting operation by defining the order of the first small component group G1S, the second small component group G2S, the second large component group G2L, and the first large component group G1L as the mounting order. In this manner, the function in which the control computer defines the mounting order of all of the electronic components corresponds to the mounting order control device of the present disclosure. Note that, the mounting order of the individual electronic components in each of the component groups is optimized using a well known method.

Figure 5A:
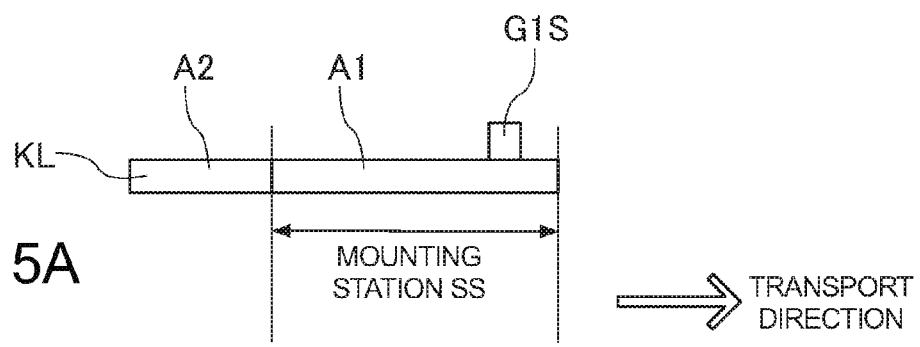
FIG. 5A to FIG. 5D represent the passage of time.

FIG. 5 is a diagram illustrating an operation in which electronic components are mounted on the long printed circuit board KL in the component mounting machine 1 of the first embodiment, and FIG. 5A to FIG. 5D represent the passage of time. As the initial state of the component mounting machine 1, the high speed mounting head 46 is equipped in the head holder 44, and the first mounting area A1 of the long printed circuit board KL is assumed to be already positioned in the mounting station SS. In FIG. 5A, the control computer causes the high speed mounting head 46 to mount the first small component group G1S. When the mounting is completed, the control computer causes the long printed circuit board KL to be conveyed in the transport direction, and causes the second mounting area A2 to be positioned so as to fit in the mounting station SS. The positioning time at this time includes all of the releasing of the clamp device, the conveying of the long printed circuit board KL, the re-positioning of the clamp device, the imaging and coordinate value correction by the board camera 47, and the like.

Figure 5B:
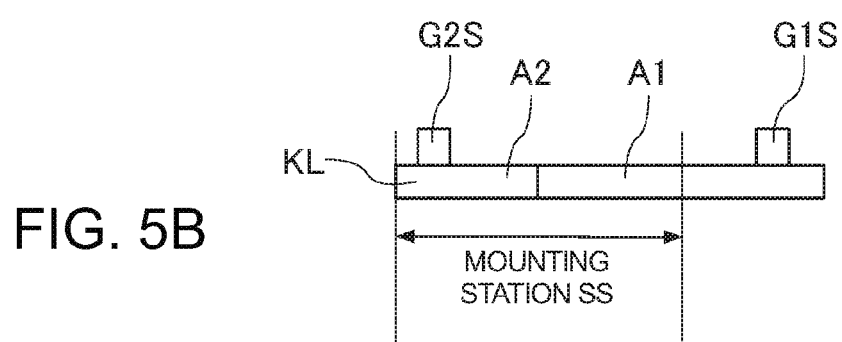
Figure 5C:
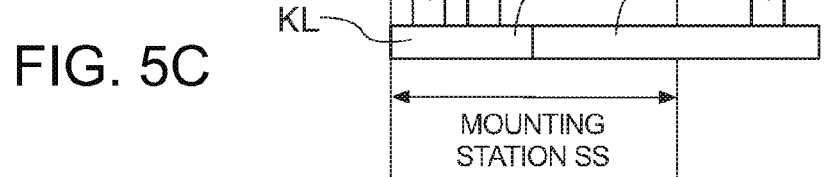
Figure 5D:
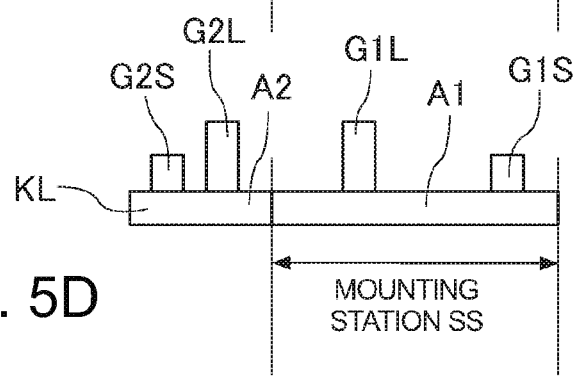

When the positioning of the second mounting area A2 is completed, in FIG. 5B, the control computer causes the high speed mounting head 46 to mount the second small component group G2S. When the mounting is completed, the control computer switches the high speed mounting head 46 of the head holder 44 for the general-purpose mounting head 45. In other words, the head holder 44 is moved to the exchanging station, the high speed mounting head 46 is removed, and the general-purpose mounting head 45 is attached. When the switching of the mounting heads is completed, in FIG. 5C, the control computer causes the general-purpose mounting head 45 to mount the second large component group G2L. When the mounting is completed, the control computer causes the long printed circuit board KL to be conveyed in the reverse direction, and causes the first mounting area A1 to be re-positioned to the mounting station SS.

When the re-positioning is completed, in FIG. 55, the control computer causes the general-purpose mounting head 45 to mount the first large component group G1L. When the mounting of the first large component group G1L is completed, the mounting of all of the electronic components is completed. The control computer conveys the long printed circuit board KL to the downstream side from the mounting station SS. A total mounting time T1 necessary for FIG. 5A to FIG. 5D with regard to a single long printed circuit board KL is a mounting time during reduced head switching T1. The mounting time during reduced head switching T1 is not only the time in which the mounting cycle is repeated, but includes the head switching time from the high speed mounting head 46 to the general-purpose mounting head 45 and the two positioning times of the long printed circuit board KL. The general-purpose mounting head 45 of the head holder 44 is returned to the high speed mounting head 46 before the next long printed circuit board KL is conveyed from the upstream side and the positioning is performed. Hereinafter, FIG. 5A to FIG. 5D are repeated a number of times equal to that of the number of long printed circuit boards KL to be produced.

The component mounting machine 1 of the first embodiment includes the board conveyance device 2 which conveys the printed circuit board K to the mounting station SS and performs positioning and carrying-out, the component supply device 3 which supplies electronic components of a plurality of component types, the component transfer device 4 which includes the mounting heads 45 and 46 which pick the electronic components from the component supply device 3, conveys the electronic components to the positioned printed circuit board K and mounts the electronic components thereon and a head driving mechanism which drives the mounting heads, and the control computer which controls changing of a mounting order of the electronic components, in which the component mounting machine 1 partitions the long printed circuit board KL of a length. Lt exceeding a length Ls of the mounting station SS into the first and second mounting areas A1 and A2, sequentially positions each of the mounting areas A1 and A2 in the mounting station SS and mounts the electronic components, in which the general-purpose mounting head 45 which is capable of mounting many types of component and the high speed mounting head 46 which is capable of mounting less types of component in comparison to the general-purpose mounting head 45, picks multiple electronic components at once, and conveys the electronic components at a low conveyance height are used together in the component transfer device 4, and in which the control computer performs control to change the mounting order of the electronic components so as to reduce at least one of a number of times a mounting head which is operating is switched and a number of times the long printed circuit board KL is positioned.

Accordingly, the number of times the mounting head is switched and the number of times the long printed circuit board is positioned are not excessively increased while mounting all of the predetermined electronic components on the first and second mounting areas A1 and A2 of the single long printed circuit board KL using the general-purpose mounting head 45 and the high speed mounting head 46 together. Therefore, the head switching time and the positioning time of the long printed circuit board KL are not excessively increased, and it is possible to shorten the total mounting time T1 (the mounting time during reduced head switching T1) in which all of the predetermined electronic components are mounted on the single long printed circuit board KL.

In the component mounting machine 1 of the first embodiment, in order to define the mounting order of the electronic components so as to reduce the number of times the mounting head is switched, the control computer first sequentially positions the first and second mounting areas A1 and A2 of the long printed circuit board KL in the mounting station SS and mounts the electronic components (the first small component group G1S and the second small component group G2S) of the component types which can be mounted by the high speed mounting head 46, and subsequently sequentially positions the second and first mounting areas A2 and A1 in the mounting station SS and mounts the electronic components (the second large component group G2L and the first large component group G1L) of the remaining component types using the general-purpose mounting head 45.

Accordingly, it is possible to mount all of the predetermined electronic components by first performing the mounting using the high speed mounting head 46 with all of the mounting areas of the long printed circuit board KL set as targets, and subsequently performing the mounting using the general-purpose mounting head 45 with all of the mounting areas set as targets. Therefore, it is possible to use as much as possible the high mounting efficiency of the high speed mounting head 46, and additionally, it is possible to limit the head switching time with the switching of the mounting head set to only one time. Accordingly, it is possible to shorten the total mounting time T1.

In the component mounting machine 1 of the first embodiment, the component transfer device 4 equips the general-purpose mounting head 45 and the high speed mounting head 46 in the head driving mechanism in an exchangeable manner. Accordingly, it is possible to carry out the present first embodiment using the automatic head exchanging component mounting machine 1, and each of the effects described earlier occurs. In the component mounting machine 1 of the first embodiment, the general-purpose mounting head 45 is a single nozzle head which includes the single suction nozzle 452 which picks the electronic component using a negative pressure, and the high speed mounting head 46 is a multi nozzle head which includes eight of the suction nozzles 462 to 464 and the revolver 461 which holds the eight suction nozzles 462 to 464 on a circular circumference and is capable of rotating.

Accordingly, it is possible to carry out the present first embodiment using the component mounting machine 1 which uses the single nozzle head and the multi nozzle head together, and at least one of the number of times the mounting head which is operating is switched and the number of times the long printed circuit board KL is positioned is reduced while using the extremely high mounting efficiency of the multi nozzle head. Therefore, it is possible to shorten the total mounting time T1.

Next, description will be given of a component mounting machine of a second embodiment, mainly the points which differ from the first embodiment. The configuration of the component mounting machine of the second embodiment is the same as in the first embodiment described with reference to FIG. 1 to FIG. 3. In the second embodiment, a portion of the control function as the mounting order control device of the control computer differs from in the first embodiment. Hereinafter, description will be given of the mounting operation to the long printed circuit board KL in the second embodiment and the control method thereof.

Firstly, the control computer partitions the long printed circuit board KL into the first mounting area A1 and the second mounting area A2, and secondly, classifies all of the predetermined electronic components to be mounted as the first small component group G1S, the first large component group G1L, the second small component group G2S, and the second large component group G2L. Up to this point is the same as in the first embodiment. Thirdly, the control computer defines the mounting order of all of the electronic components so as to reduce the number of times the positioning of the long printed circuit board KL is performed. Specifically, the control computer controls the mounting operation by defining the order of the first small component group G1S, the first large component group G1L, the second large component group G2L, and the second small component group G2S as the mounting order. In this manner, the function in which the control computer defines the mounting order of all of the electronic components corresponds to the mounting order control device of the present disclosure.

Figure 6A:
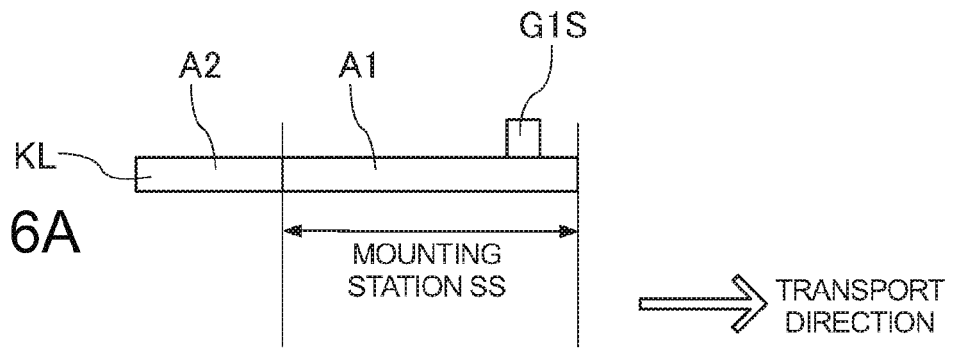
FIG. 6A to FIG. 6D represent the passage of time.
Figure 6B:
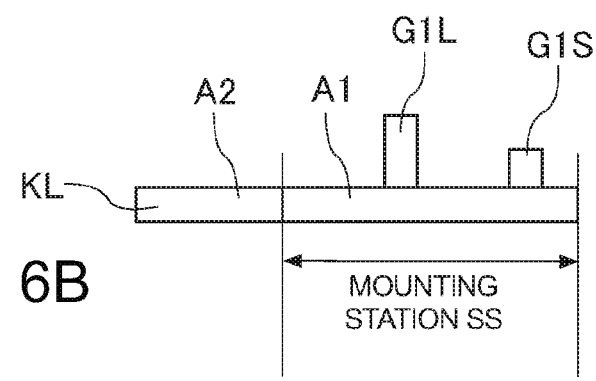
Figure 6C:
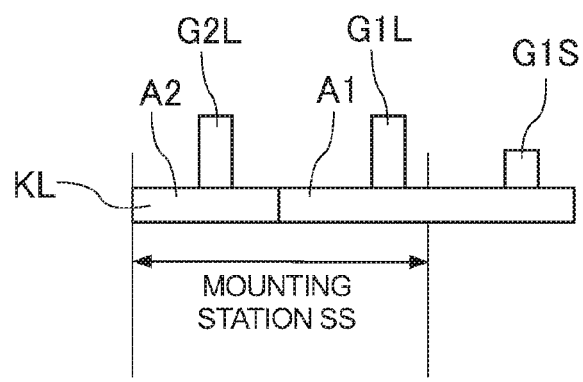
Figure 6D:
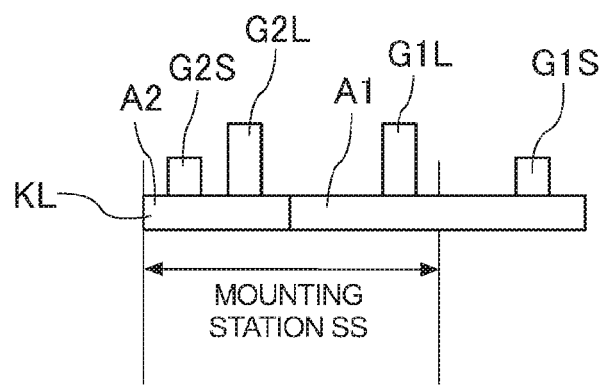

FIG. 6 is a diagram illustrating an operation in which electronic components are mounted on the long printed circuit board KL in the component mounting machine of the second embodiment, and FIG. 6A to FIG. 6D represent the passage of time. As the initial state of the component mounting machine, the high speed mounting head 46 is equipped in the head holder 44, and the first mounting area A1 of the long printed circuit board KL is assumed to be already positioned in the mounting station SS. In FIG. 6A, the control computer causes the high speed mounting head 46 to mount the first small component group G1S. When the mounting is completed, the control computer switches the high speed mounting head 46 of the head holder 44 for the general-purpose mounting head 45. When the switching of the mounting heads is completed, in FIG. 6B, the control computer causes the general-purpose mounting head 45 to mount the first large component group G1L.

When the mounting is completed, the control computer causes the long printed, circuit board KL to be conveyed in the transport direction, and causes the second mounting area A2 to be positioned so as to fit in the mounting station SS. When the positioning of the second mounting area A2 is completed, in FIG. 6C, the control computer causes the general-purpose mounting head 45 to mount the second large component group G2L. When the mounting is completed, in FIG. 6D, the control computer causes the general-purpose mounting head 45 to mount the second small component group G2S.

At this time, the reason the high speed mounting head 46 is not used even with the short and small electronic components, is that the first large component group G1L and the second large component group G2L are already mounted on the long printed circuit board KL and to avoid mutual interference between the electronic components. For example, the reason is that even if there is no concern of mutual interference between the electronic components, since time is necessary for the head switching, there is no time shortening merit even if the high speed mounting head 46 is switched in.

When the mounting of the second small component group G2S is completed, the mounting of all of the electronic components is completed. The control computer conveys the long printed circuit board KL to the downstream side from the mounting station SS. A total mounting time 12 necessary for FIG. 6A to FIG. 6D with regard to a single long printed circuit board KL is a mounting time during reduced positioning 12. The mounting time during reduced positioning T2 is not only the time in which the mounting cycle is repeated, but also includes the head switching time from the high speed mounting head 46 to the general-purpose mounting head 45 and the positioning time of the long printed circuit board KL. The general-purpose mounting head 45 of the head holder 44 is returned to the high speed mounting head 46 before the next long printed circuit board KL is conveyed from the upstream side and the positioning is performed. Hereinafter, FIG. 6A to FIG. 6D are repeated a number of times equal to that of the number of long printed circuit boards KL to be produced.

In the component mounting machine of the second embodiment, in order to define the mounting order of the electronic components so as to reduce the number of times the long printed circuit board KL is positioned, the control computer first positions the first mounting area A1 of the long printed circuit board KL in the mounting station SS and mounts the electronic components (the first small component group G1S and the first large component group G1L) which can be mounted by each of the high speed mounting head 46 and the general-purpose mounting head 45 in this order, and subsequently sequentially positions the second mounting area A2 onward of the long printed circuit board KL in the mounting station SS and mounts the remaining electronic components (the second large component group G2L and the second small component group G2S) using the general-purpose mounting head 45.

Accordingly, it is possible to mount all of the predetermined electronic components by first performing the mounting using the high speed mounting head 46 and the general-purpose mounting head 45 with the first mounting area A1 of the long printed circuit board KL set as a target, and subsequently performing the mounting using the general-purpose mounting head 45 with the second mounting area A2 onward set as targets. Therefore, the conveying and positioning of the long printed circuit board KL may be performed only once for the first and second mounting areas A1 and A2, and it is possible to limit the positioning time of the long printed circuit board L. Accordingly, it is possible to shorten the total mounting time 12 (the mounting time during reduced positioning 12).

Figure 7:
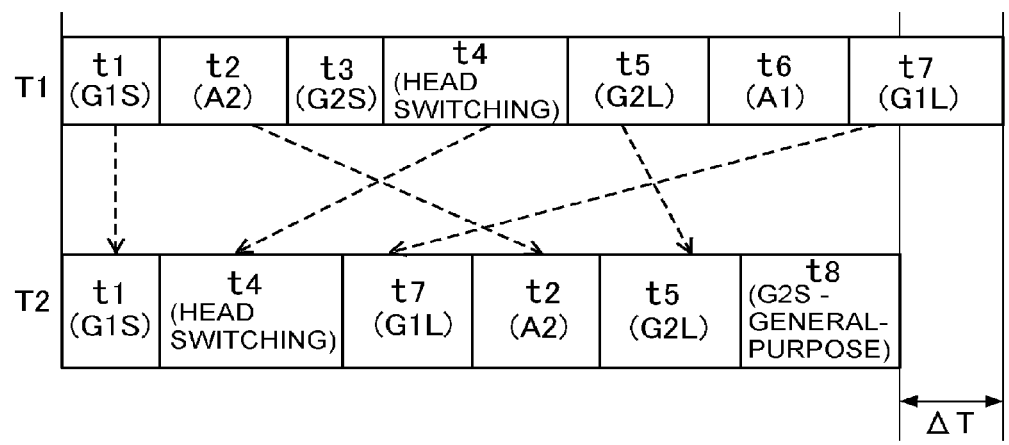
FIG. 7 is a diagram exemplifying a result of a control computer simulating two total mounting times in a third embodiment.

Next, description will be given of a component mounting machine of a third embodiment, mainly the points which differ from the first and second embodiments. In the component mounting machine of the third embodiment, the device configuration is the same as in the first and second embodiments, and the third embodiment differs in that the control computer simulates the two total mounting times T1 and T2 and adopts the one which results in the shorter time. Specifically, the control computer simulates the mounting time during reduced head switching T1 which is described with reference to FIG. 5 in the first embodiment and the mounting time during reduced positioning 12 which is described with reference to FIG. 6 in the second embodiment. FIG. 7 is a diagram exemplifying a result of the control computer simulating the two total mounting times T1 and T2 in the third embodiment.

As illustrated in FIG. 7, the mounting time during reduced head switching T1 which is the first total mounting time T1 is obtained using the sum of first to seventh times t1 to t7. It is possible to appropriately simulate each of the first to seventh times t1 to t7 based on the various design information of the long printed circuit board KL, the performance of the various components of the component mounting machine 1, and the like. Of the items within the mounting time during reduced head switching T1, the first time t1 (G1S) is the time in which the first small component group G1S is mounted by the high speed mounting head 46. The second time c2 (A2) is the time in which the second mounting area A2 of the long printed circuit board is positioned. The third time t3 (G2S) is the time in which the second small component group G2S is mounted by the high speed mounting head 46. The fourth time t4 (head switching) is the time in which the high speed mounting head 46 of the head holder 44 is switched for the general-purpose mounting head 45. The fifth time t5 (G2L) is the time in which the second large component group G2L is mounted by the general-purpose mounting head 45. The sixth time t6 (A1) is the time in which the first mounting area A1 of the long printed circuit board KL is re-positioned. The seventh time t7 (G1L) is the time in which the first large component group G1L is mounted by the general-purpose mounting head 45.

Meanwhile, the mounting time during reduced positioning 12 which is the second total mounting time 12 is obtained using the sum of the first time t1 (G1S) the fourth time t4 (head switching), the seventh time t7 (G1L), the second time t2 (A2), the fifth time t5 (G2L), and the eighth time t8 (G2S-general-purpose). Of the above-described times, even if the five times t1, t4, t7, t2, and t5 excluding the eighth time t0 (G2S-general-purpose) occur in a different order, the values themselves substantially match the simulation results of the mounting time during reduced head switching T1. The eighth time t8 (G2S-general-purpose) can be obtained using an appropriate simulation and is the time in which the second small component group G2S is mounted by the general-purpose mounting head 45. The eighth time t8 (G2S—general-purpose) becomes longer than the third time t3 (G2S) in which the second small component group G2S is mounted by the high speed mounting head 46.

In comparison with the mounting time during reduced head switching T1, the mounting time during reduced positioning T2 is unfavorable in that the third time t3 (G2S) is replaced with the eighth time t0 (G2S-general-purpose) and becomes longer, and is favorable in that the sixth time t6 (A1) can be omitted. As a result, the mounting time during reduced positioning T2 becomes a shorter time than the mounting time during reduced head switching T1 by a reduced time ΔT (refer to FIG. 7). Therefore, the control computer adopts the mounting order of the electronic components of the second embodiment. However, FIG. 7 is an example, and the magnitude relation between the mounting time during reduced head switching T1 and the mounting time during reduced positioning T2 cart change.

In the component mounting machine of the third embodiment, the control computer simulates the mounting time during reduced head switching T1 which is necessary to carry out a mounting order of electronic components which is defined in the first embodiment, and the mounting time during reduced positioning T2 which is necessary to carry out a mounting order of electronic components which is defined in the second embodiment, and adopts the mounting order of the electronic components which has a shorter time.

Here, the mounting time during reduced head switching T1 and the mounting time during reduced positioning 12 change depending on the size of the long printed circuit board KL to be produced, the type, number and mounting positions of the electronic components to be mounted, and the performance of the component mounting machine 1 and the like, and the magnitude relation between the two can change. In response to this, since the control computer performs a simulation and adopts the mounting order of the electronic components which has the shorter time, the mounting order is optimized, and it is possible to shorten the total mounting time by a maximum amount.

Figure 8:
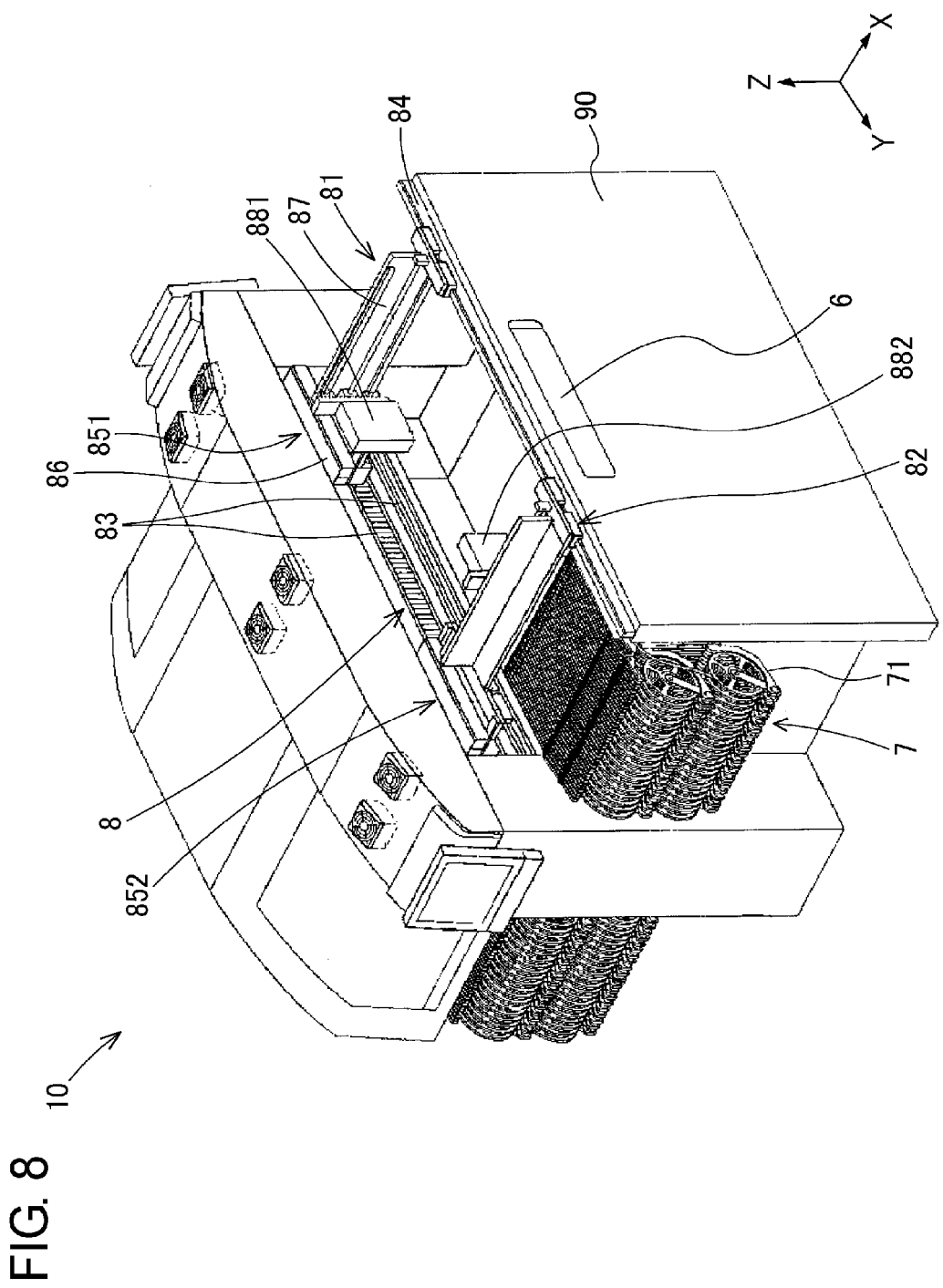
FIG. 8 is a perspective diagram illustrating the configuration of a component mounting machine of a fourth embodiment.

Next, description will be given of a component mounting machine 10 of a fourth embodiment with reference to FIG. 8. FIG. 8 is a perspective diagram illustrating the configuration of the component mounting machine 10 of the fourth embodiment. The component mounting machine 10 is formed by juxtaposing two of the two head facing type of devices, and hereinafter, description will be given of the one on the front-right side. The component mounting machine 10 is configured by a board conveyance device 6, a component supply device 7, a component transfer device 8 and the like being assembled onto a device table 90.

The board conveyance device 6 is arranged to cross the vicinity of the center of the component mounting machine 10 in the longitudinal direction in the X-axis direction. The board conveyance device 6 includes a conveying conveyor which is omitted from the drawing, and transports a printed circuit board in the X-axis direction. The board conveyance device 6 includes a clamp device which is omitted from the drawing, and positions the printed circuit board on the mounting station which is provided in the vicinity of the center of the top surface of the device table 90. The component supply device 7 is provided on each of the front portion (the front-left side of FIG. 8) and the rear portion (not visible in the drawing) of the component mounting machine 10 in the longitudinal direction. The component supply device 7 includes a plurality of cassette feeders 71 and continuously supplies components to the component transfer device 8.

The component transfer device 8 includes two sets of head driving mechanisms 81 and 82 capable of movement in the X-axis direction and the Y-axis direction. The two sets of head driving mechanisms 81 and 82 are arranged to face each other interposing the mounting station on the front side and the rear side of the component mounting machine 10 in the longitudinal direction. Each of the head driving mechanisms 81 and 82 shares a portion of a linear motor device for movement in the Y-axis direction. The linear motor device is formed of a track member 83 and an auxiliary rail 84 which are shared by the two sets of head driving mechanisms 81 and 82, and linear movable sections 851 and 852 for each of the two sets of head driving mechanisms 81 and 82.

The linear movable sections 851 and 852 are mounted to be movable on the track member 83. The linear movable sections 851 and 852 are formed of a movable main body 86, an X-axis rail 87, head holders 881 and 882, and the like. The movable main body 86 is mounted on the track member 83 and moves in the Y-axis direction. The X-axis rail 87 extends from the movable main body 86 in the X-axis direction and reaches the auxiliary rail 84. The head holders 881 and 882 are mounted on the X-axis rail 87 and move in the X-axis direction It is possible to equip the general-purpose mounting head 45 which is described in the first embodiment on the bottom side of the head holder 881 of the first head driving mechanism 81, and it is possible to equip the high speed mounting head 46 on the bottom side of the head holder 882 of the second head driving mechanism 82. Therefore, the first head driving mechanism 81 is a general-purpose side head driving mechanism 81, and the second head driving mechanism 82 is a high speed side had driving mechanism 82. In order to avoid mutual interference, only one of the general-purpose side head driving mechanism 81 and the high speed side head driving mechanism. 82 selectively enters the mounting station SS and performs the mounting operation.

Even in the component mounting machine 10 of the fourth embodiment, it is possible to perform the mounting operation to the long printed circuit board KL and the control thereof in the same manner as the first to third embodiments. However, although the mounting heads 45 and 46 are exchanged in the exchanging station in the first to third embodiments, in the fourth embodiment, the control switching of the head driving mechanisms 81 and 82 which enter the mounting station SS is performed. The fourth time t4 (head switching) in which the high speed mounting head 46 of the head holder 44 is switched for the general-purpose mounting head 45 is interpreted as the time in which the high speed side head driving mechanism 82 which enters the mounting station is switched with the general-purpose side head driving mechanism 81.

In the component mounting machine 10 of the fourth embodiment, the component transfer device 8 includes the general-purpose side head driving mechanism 81 which drives the general-purpose mounting head and the high speed side head driving mechanism 82 which drives the high speed mounting head, and causes one of the general-purpose side head driving mechanism 81 and the high speed side head driving mechanism 82 to operate in the mounting station SS in a switchable manner.

Accordingly, it is possible to carry out the present disclosure using the two head facing component mounting machine 10, and each of the effects of the first to third embodiments described earlier occurs.

Note that, the mounting heads 45 and 46 are not limited to the two types, and it is possible to use three or more types of mounting heads together. For example, in the configuration of the first embodiment, it is possible to dispose the general-purpose mounting head 45 which includes one suction nozzle, a medium speed mounting head which includes four suction nozzles, and the high speed mounting head which includes twelve suction nozzles in the exchanging station and to use these in a switchable manner. In this aspect, in order to reduce the number of times the mounting heads are switched when performing the mounting operation to the long printed circuit board KL, the high speed mounting head is used first, the medium speed mounting head next, and the general-purpose mounting head 45 last to mount all of the electronic components, and the conveying and positioning of the long printed circuit board KL are performed a number of times which is necessary as a result, in this aspect, in order to reduce the number of times the long printed circuit board KL is positioned, first, the positioning is performed in the first mounting area A1, and the mounting operation is performed in the order of the it speed mounting head, the medium speed mounting head, and the general-purpose mounting head 45. Next, the positioning is performed in the second mounting area A2, if the high speed mounting head or the medium speed mounting head is possible to use and there is a time shortening merit, these are used in preference, and if not, only the general-purpose mounting head 45 is used, and the remaining electronic components are mounted.

The function of the mounting order control device can be realized using an external device instead of the control computer of the inside portion of the component mounting machine 1 or 10. In other words, if the function described above is realized by a super ordinate management server or the like which shares various design information of the long printed circuit board KL, it is possible to define the mounting order of all of the electronic components by performing the simulations of the total mounting times T1 and T2, and it is possible to instruct the control computer of the component mounting machine 1 or 10 of the defined mounting order. It is possible to apply various other adaptations and modifications to the present disclosure.

REFERENCE SIGNS LIST 1, 10: component mounting machine, 2: board conveyance device, 3: component supply device, 4: component transfer device, 44: head holder, 45: general-purpose mounting head, 452: suction nozzle, 46: high speed mounting head, 462 to 464: suction nozzle, 5: component camera, 6: board conveyance, device, 7: component supply device, 8: component transfer device, 81: general-purpose side head driving mechanism, 881: head holder, 82: high speed side head driving mechanism, 882: head holder, KL: long printed circuit board, Lt: total length of long printed circuit board, Ls: length of mounting station, A1: first mounting area, A2: second mounting area, G1S: first small component group, G1L: first large component group, G2S: second small component group, G2L: second large component group, T1: mounting time during reduced head switching, T2: mounting time during reduced positioning.

The invention claimed is:

1. A component mounting machine comprising:
a board conveyance device which conveys a printed circuit board to a mounting station and performs positioning and carrying-out;
a component supply device which supplies electronic components of a plurality of component types;
a component transfer device which includes a mounting head which picks the electronic components from the component supply device, conveys the electronic components to the positioned printed circuit board and mounts the electronic components thereon and a head driving mechanism which drives the mounting head; and
a mounting order control device which controls changing of a mounting order of the electronic components, wherein the component mounting machine partitions a long printed circuit board of a length exceeding the mounting station into a plurality of mounting areas, sequentially positions each mounting area in the mounting station and mounts the electronic components, wherein a general-purpose mounting head which is capable of mounting many types of component and a high speed mounting head which is capable of mounting less types of component in comparison to the general-purpose mounting head, picks multiple electronic components at once, and conveys the electronic components at a low conveyance height are used together in the component transfer device, and wherein the mounting order control device performs control to change the mounting order of the electronic components so as to reduce at least one of a number of times a mounting head which is operating is switched and a number of times the long printed circuit board is positioned.

2. The component mounting machine according to claim 1, wherein the mounting order control device determines the mounting order of the electronic components so as to reduce the number of times the mounting head is switched, first by sequentially positioning each of the mounting areas of the long printed circuit board in the mounting station and causing the high speed mounting head to mount the electronic components of the component types which can be mounted, and subsequently by sequentially positioning each of the mounting areas in the mounting station and causing the general-purpose mounting head to mount the electronic components of the remaining component types.

3. The component mounting machine according to claim 1, wherein the mounting order control device determines the mounting order of the electronic components so as to reduce the number of times the long printed circuit board is positioned, first by positioning a first mounting area of the long printed circuit board in the mounting station and causing each of the high speed mounting head and the general-purpose mounting head, in this order, to mount the electronic components which can be mounted, and subsequently by sequentially positioning a second mounting area onward of the long printed circuit board in the mounting station and causing the general-purpose mounting head to mount the remaining electronic components.

4. The component mounting machine according to claim 1, wherein the mounting order control device simulates a mounting time during reduced head switching which is necessary to carry out a mounting order of electronic components, and a mounting time during reduced positioning which is necessary to carry out a mounting order of electronic components, and adopts the mounting order of the electronic components which has a shorter time.

5. The component mounting machine according to claim 1, wherein the component transfer device equips the general-purpose mounting head and the high speed mounting head in the head driving mechanism in an exchangeable manner.

6. The component mounting machine according to claim 1,
  wherein the component transfer device includes a general-purpose side head driving mechanism which drives the general-purpose mounting head and a high speed side head driving mechanism which drives the high speed mounting head, and causes one of the general-purpose side head driving mechanism and the high speed side head driving mechanism to operate in the mounting station in a switchable manner.

7. The component mounting machine according to claim 1,
  wherein the general-purpose mounting head is a single nozzle head which includes a single suction nozzle which adhesively picks the electronic component using a negative pressure, and
  wherein the high speed mounting head is a multi nozzle head which includes a plurality of the suction nozzles and a revolver which holds the plurality of suction nozzles on a circular circumference and is capable of rotating.

\* \* \* \* \*